(12) United States Patent
Huang et al.

(10) Patent No.: US 8,453,983 B2
(45) Date of Patent: Jun. 4, 2013

(54) ELECTRONIC DEVICE WITH SUPPORTING APPARATUS

(75) Inventors: Ri-Dong Huang, Shenzhen (CN); Guang-Yao Lee, New Taipei (TW)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 23 days.

(21) Appl. No.: 13/333,902

(22) Filed: Dec. 21, 2011

(65) Prior Publication Data

US 2013/0113346 A1     May 9, 2013

(30) Foreign Application Priority Data

Nov. 4, 2011   (CN) .......................... 2011 1 0345362

(51) Int. Cl.
*A47B 96/00*   (2006.01)

(52) U.S. Cl.
USPC ................. 248/222.12; 248/346.04; 248/917; 248/918

(58) Field of Classification Search
USPC ............... 248/222.11, 222.12, 223.41, 224.7, 248/346.03, 346.04, 917, 918; 361/679.21
See application file for complete search history.

(56) References Cited

U.S. PATENT DOCUMENTS

| | | | | |
|---|---|---|---|---|
| 2,476,134 A * | 7/1949 | Care | ................................. | 232/7 |
| 5,611,650 A * | 3/1997 | Perkins et al. | .................. | 408/87 |
| 6,108,195 A * | 8/2000 | Behl et al. | ................ | 361/679.23 |
| 7,301,760 B2 * | 11/2007 | Chen | ........................ | 361/679.27 |
| 7,436,655 B2 * | 10/2008 | Homer et al. | ............ | 361/679.55 |
| 7,455,267 B2 * | 11/2008 | Kim | ................... | 248/65 |
| 7,494,105 B2 * | 2/2009 | Ishii et al. | ..................... | 248/615 |
| 7,495,897 B2 * | 2/2009 | Yokawa | ................... | 361/679.22 |
| 8,011,624 B2 * | 9/2011 | Fujikawa et al. | .......... | 248/188.1 |
| 8,196,880 B2 * | 6/2012 | Fujikawa et al. | .......... | 248/188.1 |

* cited by examiner

*Primary Examiner* — Gwendolyn Baxter
(74) *Attorney, Agent, or Firm* — Altis Law Group, Inc.

(57) ABSTRACT

A supporting apparatus for an electronic device chassis includes a base, a supporting assembly fixed to the base to detachably mount the chassis, a guiding block, an operation member, and a latching member. The guiding block is slidably attached to the supporting assembly along a first direction. The latching member and the operation member are slidably attached to the guiding block along a second direction perpendicular to the first direction. A first protrusion with a first slope and a second protrusion with a second slope protrude from the guiding block. The operation member includes a first sliding block with a third slope abutting against the second slope. The latching member includes a second sliding block with a fourth slope abutting against the first slope. An inserting pin extends up from the guiding block, to engage in the chassis.

19 Claims, 8 Drawing Sheets

ELECTRONIC DEVICE WITH SUPPORTING APPARATUS

BACKGROUND

1. Technical Field

The present disclosure relates to electronic devices and, particularly, to an electronic device having a supporting apparatus.

2. Description of Related Art

An electronic device, such as a computer or a server, is secured to a supporting mechanism by a plurality of screws. However, it is time-consuming and often difficult to assemble or disassemble the supporting mechanism from the electronic device.

BRIEF DESCRIPTION OF THE DRAWINGS

The components of the drawings are not necessarily drawn to scale, the emphasis instead being placed upon clearly illustrating the principles of the embodiments. Moreover, in the drawings, like reference numerals designate corresponding parts throughout several views.

DETAILED DESCRIPTION

The present disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
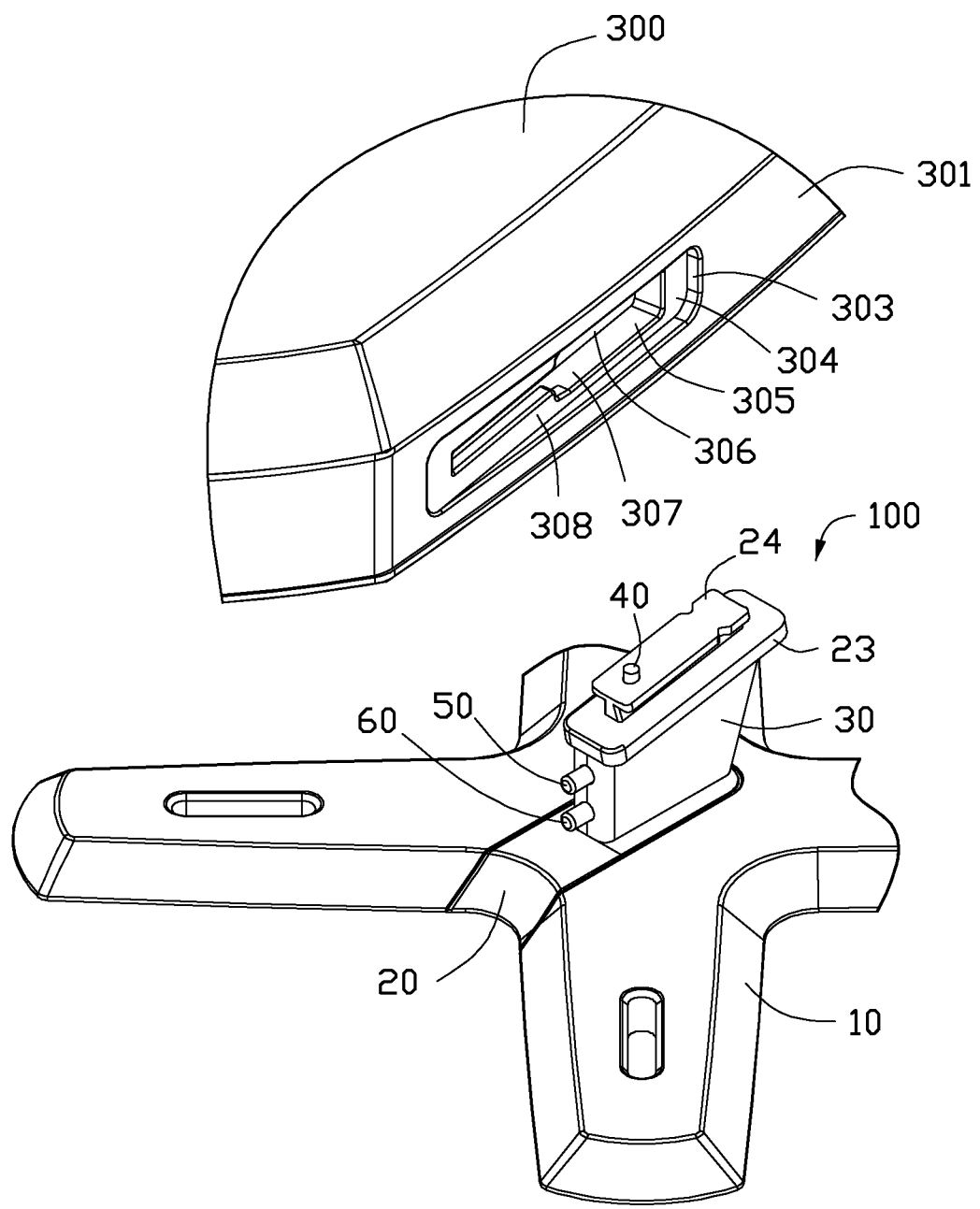
FIG. 1 is an exploded, isometric view of an exemplary embodiment of an electronic device, wherein the electronic device includes a supporting apparatus.
Figure 2:
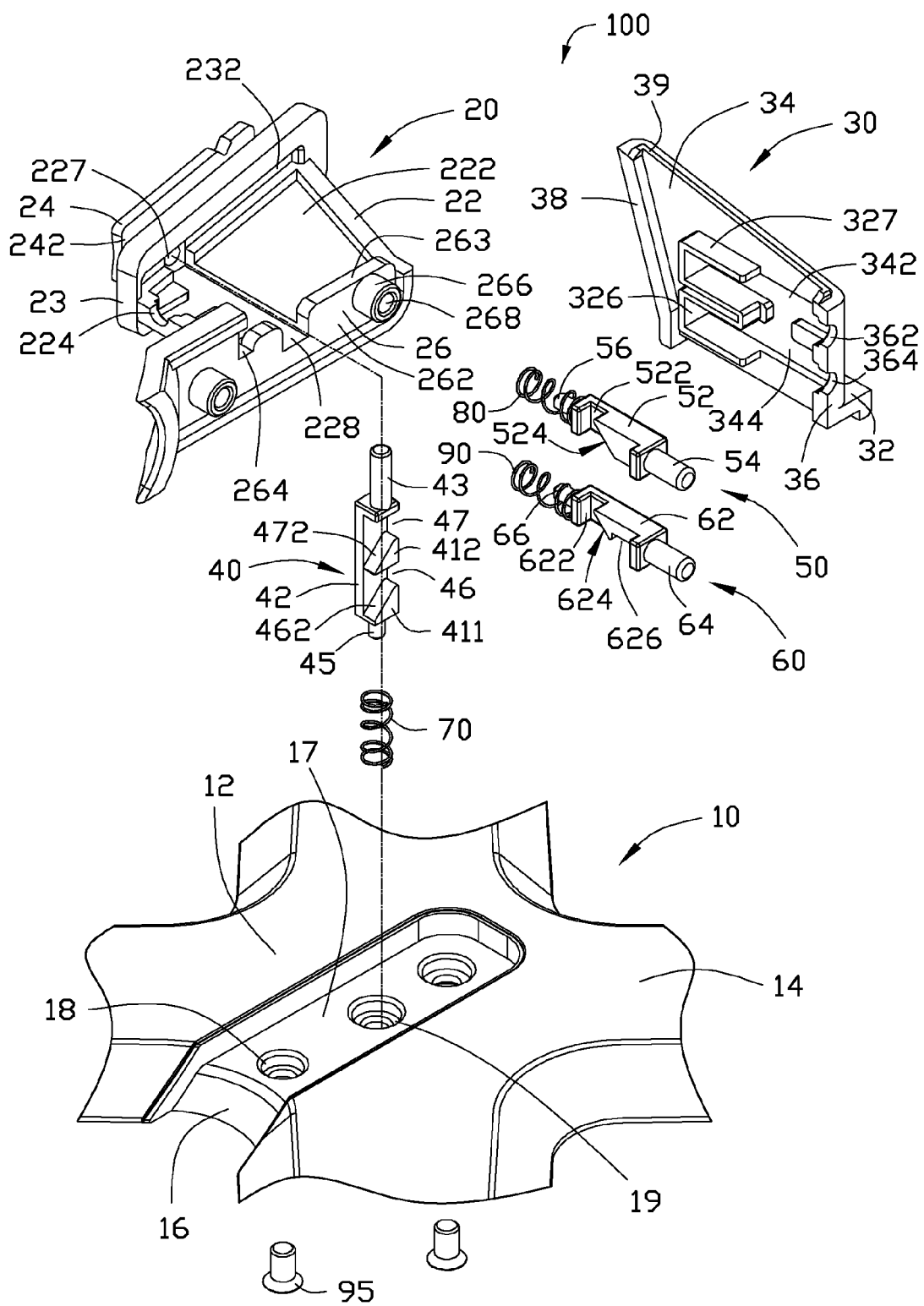
FIG. 2 is an exploded, isometric view of the supporting apparatus of FIG. 1.
Figure 3:
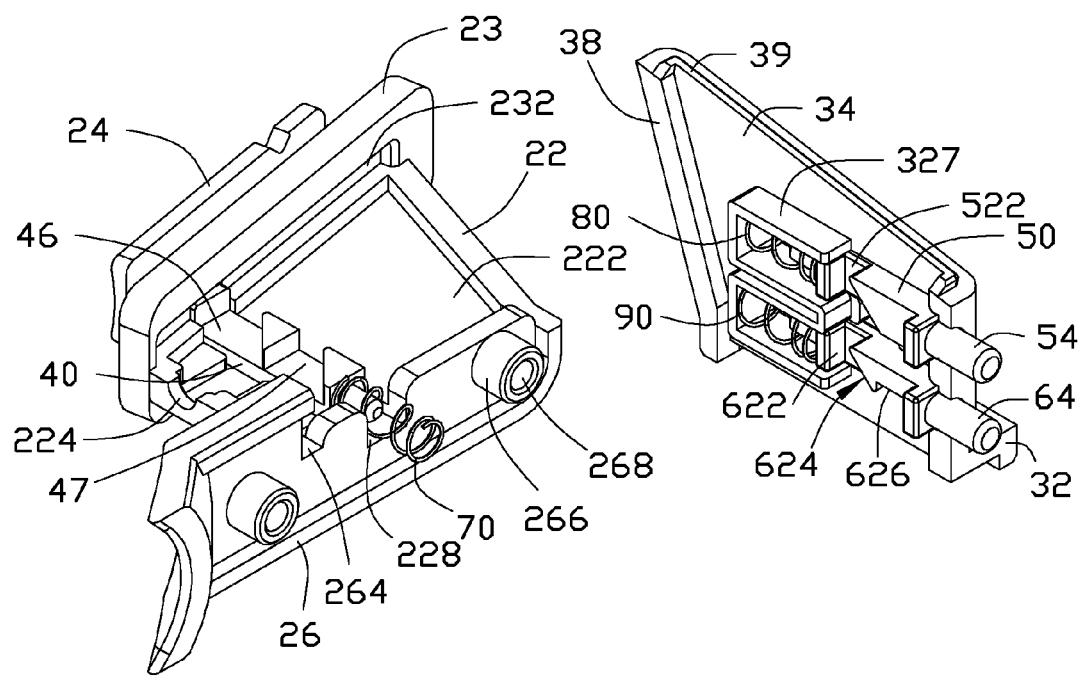
FIG. 3 is a partially assembled, isometric view of FIG. 2.

FIGS. 1-3, is an embodiment of an electronic device including a chassis 300, and a supporting apparatus 100 for supporting the chassis 300. The supporting apparatus 100 includes a base 10, a supporting assembly with a connecting member 20 and an attachment member 30, an inserting member 40, an operation member 50, a latching member 60, a first resilient member 70, a second resilient member 80, and a third resilient member 90.

Figure 5:
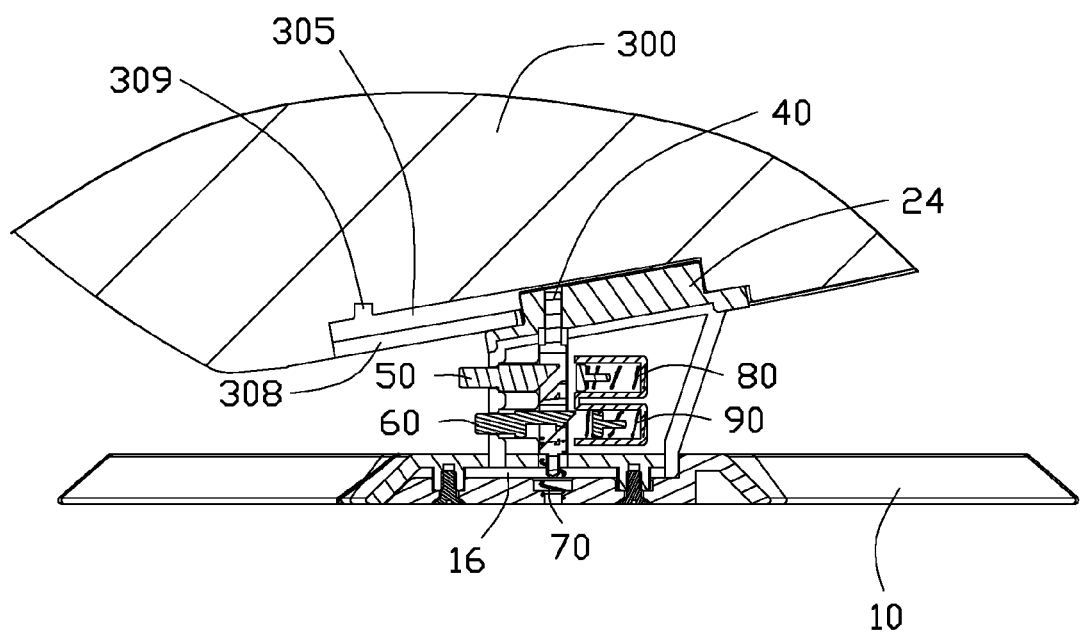
FIGS. 5-8 are sectional views of FIG. 4, showing the processes of assembling the electronic device.
Figure 6:
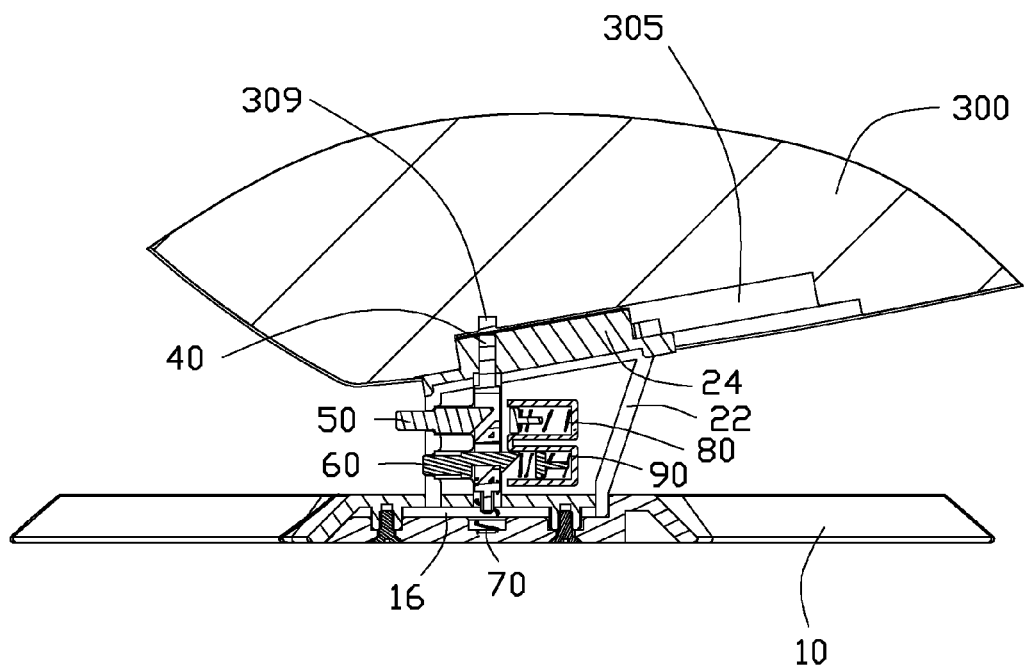
Figure 7:
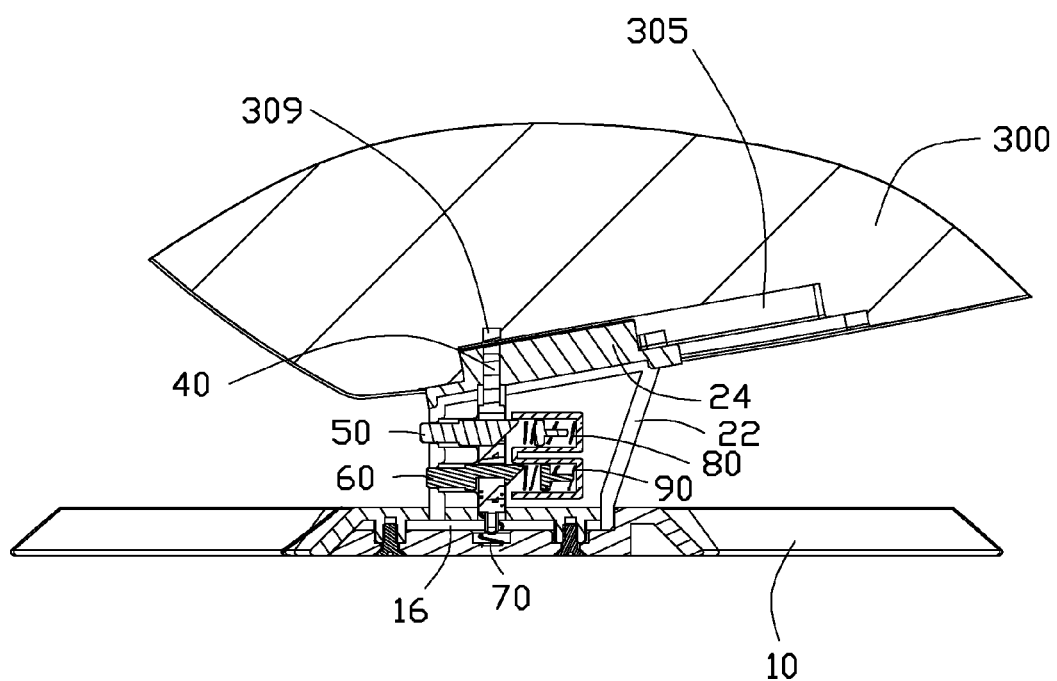

The chassis 300 includes a bottom wall 301. The bottom wall 301 defines a long depressed portion 303 with a top surface 304. A long mounting slot 305 is defined in a middle of the top surface 304, extending along a length of the depressed portion 303. The mounting slot 305 includes a top wall 306 and two opposite sidewalls 307. Two latching blocks 308 extend from the bottoms of the sidewalls 307 toward each other, adjacent to an end of the depressed portion 303. The top wall 306 defines an inserting hole 309 (shown in FIG. 5) between the latching blocks 308.

The base 10 includes a fixing portion 12 and four feet 14 extending out from edges of the fixing portion 12. A top of the fixing portion 12 defines a long installation slot 16 extending through one of the edges of the fixing portion 12. The installation slot 16 includes a bottom surface 17. The bottom surface 17 defines two spaced first stepped holes 18 and a second stepped hole 19 between the first stepped holes 18.

The connecting member 20 includes a top piece 23, a main portion 22 extending down from the top piece 23. A T-shaped sliding portion 24 extending up from the top piece 23 opposite to the main portion 22, and an installation portion 26 extending from a side surface of the main portion 22 adjacent to a bottom of the main portion 22 opposite to the top piece 23. A receiving space 222 is defined in the side surface of the main portion 22. Two semicircular openings 224 are defined in a front wall of the main portion 22. A through hole 227 is defined in the top piece 23 and extends through the sliding portion 24. A guide slot 228 is defined in the receiving space 222 and extends through the installation portion 26, communicating with the through hole 227. A bottom of the top piece 23 defines an attachment slot 232, at a side of the receiving space 222. The sliding portion 24 and the top piece 23 cooperatively bound two opposite slide slots 242. The installation portion 26 includes a bottom piece 262 substantially parallel to the top piece 23. A side of the bottom piece 262 defines a cutout 263 facing the attachment slot 232 adjacent to an end of the bottom piece 262. The guide slot 228 extends through the bottom piece 262. The bottom piece 262 defines a notch 264 adjacent to the openings 224. Two installation pins 266 extend down from the bottom piece 262, each installation pin 266 axially defines a screw hole 268.

The attachment member 30 includes a bottom piece 32, a side plate 34 perpendicularly extending up from a side of the bottom piece 32. In addition, a front plate 36 extends from a front end of the side plate 34 away from the bottom piece 32, and a rear plate 38 extends from a rear end of the side plate 34 opposite to the front plate 36. An inner surface of the side plate 34 defines a first slide slot 342 extending along a direction substantially parallel to the bottom piece 32, and a second slide slot 344 parallel to the first slide slot 342. Two U-shaped positioning portions 326 and 327 extend out from rear ends of the first and second slide slot 342 and 344, adjacent to the rear plate 38. The front plate 36 defines two semicircular openings 362 and 364. A flange 39 extends up from tops of the side plate 34, the front plate 36, and the rear plate 38.

The inserting member 40 includes a bar-shaped guiding block 42, an inserting pin 43 extending up from a top end of the guiding block 42, a fixing pin 45 extending down from a bottom end of the guiding block 42 opposite to the inserting pin 43. A triangular first protrusion 411 extends out from a side surface of the guiding block 42, adjacent to the fixing pin 45. A triangular second protrusion 412 extends out from the side surface of the guiding block 42, adjacent to the inserting pin 43. The first protrusion 411 and the second protrusion 412 cooperatively bound a first fitting slot 46. The second protrusion 412 and the top end of the guiding block 42 cooperatively bound a second fitting slot 47. A first slope 462 is formed on the first protrusion 411, facing the second protrusion 412. A second slope 472 is formed on the second protrusion 412, facing the top end of the guiding block 42.

The operation member 50 includes a bar-shaped sliding block 52, an operation pin 54 extending forward from a front end of the sliding block 52, and a fixing pin 56 extending rearward from a rear end of the sliding block 52 opposite to the operation pin 54. A side surface of the sliding block 52 defines a third fitting slot 522 adjacent to the fixing pin 56, and the third fitting slot 522 extends through a top surface and a bottom surface of the sliding block 52. A third slope 524 is formed on the sliding block 52 facing the third fitting slot 522 and opposite to the fixing pin 56.

The latching member 60 includes a bar-shaped sliding block 62, an operation pin 64 extending forward from a front end of the sliding block 62, and a fixing pin 66 extending rearward from a rear end of the sliding block 62 opposite to the operation pin 64. A side surface of the sliding block 62 defines a fourth fitting slot 622 adjacent to the fixing pin 66, and the fourth fitting slot 622 extends through a top surface and a bottom surface of the sliding block 62. A fourth slope 624 is formed on the sliding block 62 facing the fourth fitting slot 622 and opposite to the fixing pin 66. The bottom surface of the sliding block 62 defines a locating slot 626 adjacent to the operation pin 64.

In the embodiment, the first resilient 70, the second resilient 80, and the third resilient 90 are coil springs.

Figure 4:
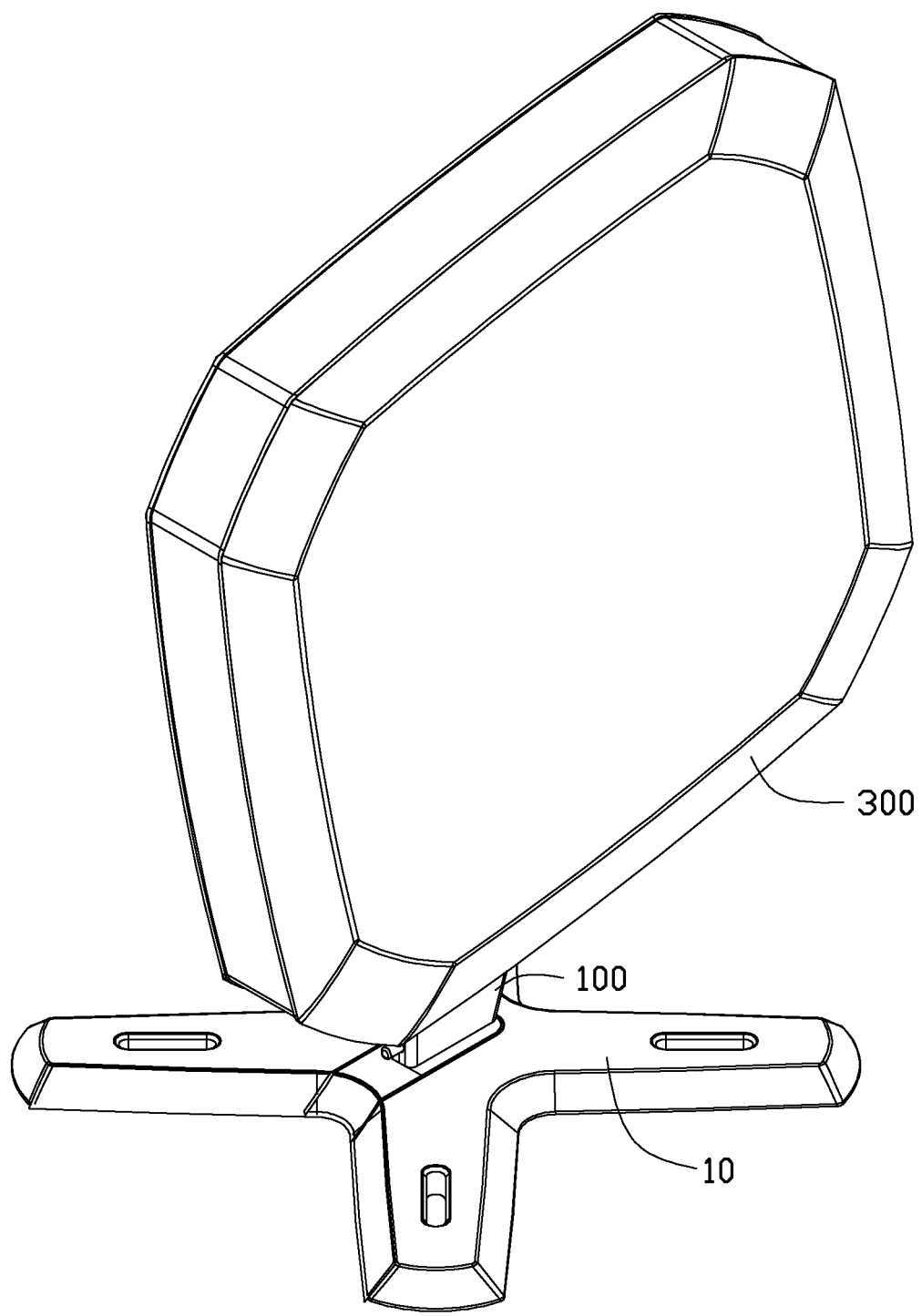
FIG. 4 is an assembled, isometric view of FIG. 1.

Referring to FIG. 4, in assembly of the supporting apparatus 100, the guiding block 42 is slidably received in the guide slot 228, with the first protrusion 411 opposite to the main portion 22. The inserting pin 43 is inserted into the through hole 227. The sliding block 52 is slidably received in the first slide slot 342, with the third fitting slot 522 opposite to the side plate 34. The operation pin 54 is slidably inserted into the opening 362. A first end of the second resilient member 80 abuts against the positioning portion 327. A second end of the second resilient member 80 fits about the fixing pin 56 and abuts against the rear end of the sliding block 52. The sliding block 62 is slidably received in the second slide slot 344, with the fourth fitting slot 622 opposite to the side plate 34. The operation pin 64 is slidably inserted into the opening 364. A first end of the third resilient member 90 abuts against the positioning portion 326. A second end of the third resilient member 80 fits about the fixing pin 66 and abuts against the rear end of the sliding block 62.

Figure 8:
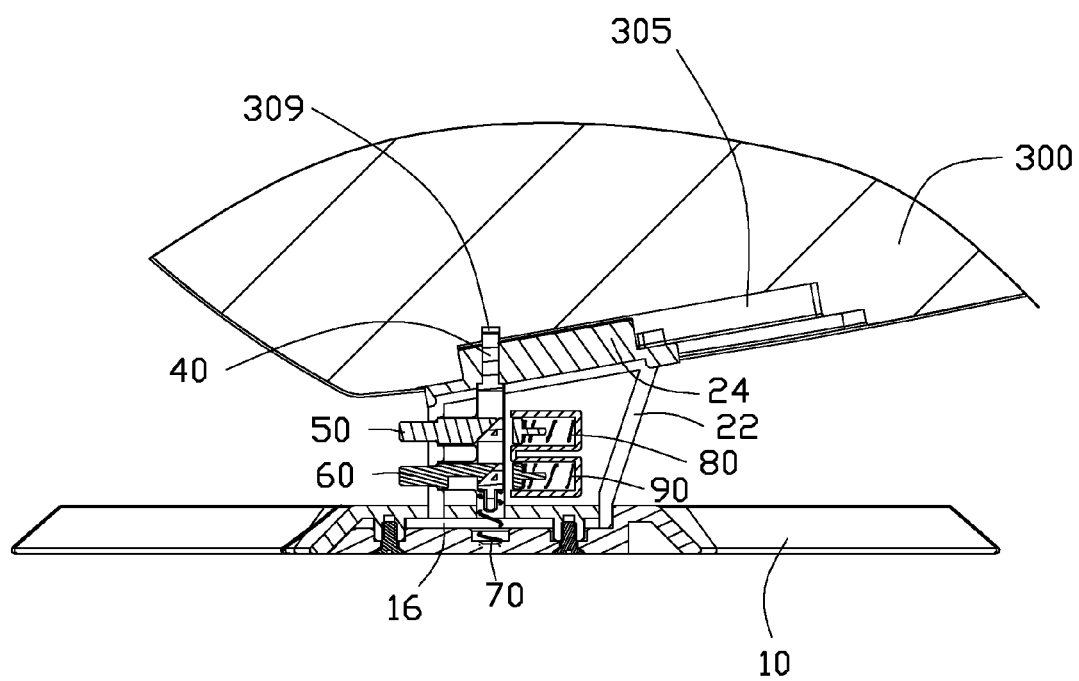

The attachment member 30 is attached to the connecting member 20. The flange 39 is inserted into the attachment slot 232. The front plate 36 is inserted into the notch 264. The sliding block 52 is slidably received in the second fitting slot 47, with the third fitting slot 522 facing the second fitting slot 47. The third slope 524 is slidably engaged with the second slope 472 (shown in FIG. 8). The sliding block 62 is slidably received in the first fitting slot 46, with the fourth fitting slot 622 facing the first fitting slot 46. The fourth slope 624 is slidably engaged with the first slope 462 (shown in FIG. 8).

A first end of the first resilient member 70 fits about the fixing pin 45. The installation portion 26 and the bottom piece 32 are inserted into the installation slot 16. The installation pins 266 are inserted into the corresponding first stepped holes 18 and are supported on stepped portions of the first stepped holes 18. A second end of the first resilient member 70 is inserted into the second stepped hole 19, and is supported on the stepped portion of the second stepped hole 19. Two screws 95 extend through the first stepped holes 18 from the bottom surface of the base 10, to be screwed into the corresponding screw holes 268. Therefore, the inserting member 40 can be slidably received in the guide slot 228, and the bottom end of the guiding block 42 is supported on the stepped portion of the second stepped hole 19. The opening 362 communicates with the opening 224 adjacent to the top piece 23, to cooperatively and slidably receive the operation pin 54. The sliding block 52 is blocked by an inner surface of the front plate 36 facing the rear plate 38. The opening 364 communicates with the opening 224 adjacent to the installation portion 26, to cooperatively and slidably receive the operation pin 64. The sliding block 62 is blocked by the inner surface of the front plate 36.

Referring to FIGS. 5 to 8, to mount the chassis 300 to the supporting apparatus 100, the operation pin 64 is pressed, to slide the sliding block 62 toward the positioning portion 326 along the second sliding slot 344. The third resilient member 90 is deformed. The fourth slope 624 slidably abuts against the first slope 462, to move the inserting member 40 down toward the base 10 along the guide slot 228. Therefore, the inserting pin 43 is withdrawn in the through hole 227. The first resilient member 70 is deformed. After the first protrusion 411 is latched into the locating slot 626, the inserting member 40 is positioned.

The sliding portion 24 is inserted into the mounting slot 305, away from the latching blocks 308. A top surface of the sliding portion 24 slidably engages with the top wall 306. A top surface of the top piece 23 slidably engages with the top surface 304. The chassis 300 is pushed, to allow the latching blocks 308 to slide along the corresponding slide slots 242, until the inserting hole 309 aligns with the inserting pin 43. The operation pin 54 is pressed toward the positioning portion 327 along the first slide slot 342, to deform the second resilient 80. The third slope 524 slidably abuts against the second slope 472, to allow the inserting member 40 to slide further toward the base 10. The first resilient member 70 is further deformed. After the first protrusion 411 is disengaged from the locating slot 626, the third resilient member 90 is restored to bias the sliding block 62 to move toward the front plate 36 until the front plate 36 blocks the sliding block 62. The operation pin 54 is released. The second resilient member 80 is restored to allow the sliding block 52 to slide toward the front plate 36, the second slope 472 is disengaged from the third slope 524, the first resilient member 70 restores to resist the inserting member 40 from sliding up along the guide slot 228. The inserting pin 43 extends through the through hole 227, to be inserted into the inserting hole 309. Therefore, the chassis 300 is firmly supported on the supporting apparatus 100.

To detach the chassis 300 from the supporting apparatus 100, the operation pin 64 is pressed to slide the sliding block 62 along the second sliding slot 344. The third resilient member 90 is deformed. The fourth slope 624 slidably abuts against the first slope 462, to allow the inserting member 40 to slide along the guide slot 228 toward the base 10, deforming the first resilient member 70, until the first protrusion 411 latches into the locating slot 626. The inserting pin 43 is disengaged from the inserting hole 309 and withdrawn into the through hole 227. The supporting apparatus 100 is moved to make the sliding portions 24 disengage from the mounting slot 305. Therefore, the chassis 300 may be detached from the supporting apparatus 100 easily.

Even though numerous characteristics and advantages of the embodiment(s) have been set forth in the foregoing description, together with details of the structures and functions of the embodiment(s), the disclosure is illustrative only, and changes may be made in detail, especially in the matters of shape, size, and the arrangement of parts within the principles of the disclosure to the full extent indicated by the broad general meaning of the terms in which the appended claims are expressed.

What is claimed is:

1. A supporting apparatus for an electronic device, the supporting apparatus comprising:
    a base;
    a supporting assembly comprising a bottom fixed on the base, and a top for detachably mounting the electronic device;
    an inserting member slidably attached to the supporting assembly along a first direction, and comprising a guiding block, a first protrusion protruding out from a side surface of the guiding block, a second protrusion protruding out from the side surface of the guiding block, and an inserting pin extending up from a top of the guiding block, wherein a first slope is formed on the first protrusion, a second slope is formed on the second protrusion;

a first resilient member connected between the inserting member and the base to bias the inserting pin upwards to latch the electronic device;

an operation member slidably attached to the supporting assembly along a second direction perpendicular to a first direction, the operation member comprising a first sliding block with a third slope; and a latching member slidably attached to the supporting assembly along the second direction, the latching member comprising a second sliding block with a fourth slope, wherein when the latching member is slid for allowing the fourth slope to abut against the first slope of the first protrusion of the inserting member, the inserting pin is disengaged from the electronic device, the first protrusion is latched to the second sliding block to position the inserting pin; and when the first protrusion is latched to the second sliding block and the operation member is slid for allowing the third slope of the first sliding block to abut against the second slope of the second protrusion of the inserting member, the first protrusion is disengaged from the second sliding block such that first resilient member pushes the inserting pin up to let it latch the electronic device.

2. The supporting apparatus of claim 1, wherein the supporting assembly comprises a connecting member and an attachment member assembled to the connecting member, the inserting member is slidably attached to the connecting member, the operation member and the latching member are slidably attached to the attachment member.

3. The supporting apparatus of claim 2, wherein the connecting member comprises a top piece, a main portion extending down from the top piece, a sliding portion extending up from the top piece opposite to the main portion, and an installation portion extending from a side surface of the main portion and adjacent to a bottom of the main portion opposite to the top piece, the sliding portion is slidably attached to the electronic device, the installation portion is fixed to the base.

4. The supporting apparatus of claim 3, wherein a receiving space is defined in the side surface of the main portion, the inserting member is slidably received in the receiving space, a through hole is defined in the top piece extending through the sliding portion and communicating with the receiving space, the inserting pin extends through the through hole to latch the electronic device.

5. The supporting apparatus of claim 4, wherein the main portion defines a guide slot in the receiving space, and the guide slot communicates with the through hole and extends through the installation portion, the inserting member is slidably received in the guide slot, a fixing pin protrudes from the inserting member opposite to the inserting pin, a first end of the first resilient member fits about the fixing pin, and a second end of the first resilient member is resiliently abutted against the base.

6. The supporting apparatus of claim 5, wherein the fixing pin extends from a bottom end of the guiding block, the first protrusion and the second protrusion are located on a same side surface of the guiding block, a first slot is defined between the first and second protrusions for receiving the second sliding block of the latching member, a second slot is defined between the second protrusion and the top end of the guiding block for receiving the first sliding block of the operation member.

7. The supporting apparatus of claim 4, wherein the attachment member comprises a bottom piece, a side plate extending up from a side of the bottom piece, and a front plate extending from a front end of the side plate, the side plate defines a first slide slot and a second slide slot parallel to the first slide slot, the operation member is slidably received in the first slide slot, the latching member is slidably received in the second slide slot, the supporting apparatus further comprises a second resilient member connected between the side plate of the attachment member and the operation member, and a third resilient member connected between the side plate of the attachment member and the latching member.

8. The supporting apparatus of claim 7, wherein the front plate of the attachment member defines two openings, an operation pin extends from a front end of each of the operation member and the latching member, to slidably extend through a corresponding one of the openings.

9. The supporting apparatus of claim 7, wherein the base defines an installation slot, the installation portion of the connecting member and the bottom piece of the attachment member are inserted into the installation slot.

10. The supporting apparatus of claim 7, wherein a bottom of the top piece defines an attachment slot at a side of the receiving space of the connecting member, the installation portion defines a cutout facing the attachment slot and communicating with the guide slot, and a notch communicating with the cutout, a flange protrudes from the side plate of the attachment member to be latched in the attachment slot, the front plate of the attachment member is latched into the notch.

11. The supporting apparatus of claim 1, wherein the second sliding block defines a locating slot for latching the first protrusion.

12. An assembly comprising:

an electronic device chassis defining an inserting hole; and a supporting apparatus detachably supporting the chassis and comprising:

a base;

a supporting assembly connected between the chassis and the base;

an inserting member comprising a guiding block slidably attached to the supporting assembly along a first direction, a first protrusion protruding out from a side surface of the guiding block, a second protrusion protruding out from the side surface of the guiding block, and an inserting pin extending up from a top of the guiding block, wherein a first slope formed on the first protrusion, a second slope formed on the second protrusion;

a first resilient member connected between the inserting member and the base, to bias the inserting member to allow the inserting pin to engage in the inserting hole;

an operation member comprising a first sliding block slidably attached to the inserting member along a second direction perpendicular to the first direction, a third slope formed on the first sliding block; and a latching member comprising a second sliding block slidably attached to the inserting member along the second direction, a fourth slope formed on the second sliding block;

wherein when the latching member is operable to slide along the second direction for allowing the fourth slope to abut against the first slope of the first protrusion of the inserting member, the inserting pin is slid along the first direction to be disengaged from the inserting hole, the first protrusion is latched to the second sliding block to position the inserting pin; and when the first protrusion is latched to the second sliding block and the operation member is operable to slide along the second direction for allowing the third slope of the first sliding block to abut against the second slope of the second protrusion of the inserting member, the first protrusion is disengaged from the second sliding block such that first resilient member pushes the inserting pin up to let it latch the electronic device.

13. The assembly of claim 12, wherein the supporting assembly comprises a connecting member and an attachment member assembled to the connecting member, the inserting member is slidably attached to the connecting member, the operation member and the latching member are slidably attached to the attachment member.

14. The assembly of claim 13, wherein the attachment member comprises a bottom piece, a side plate extending up from a side of the bottom piece, and a front plate extending from a front end of the side plate, the side plate defines a first slide slot and a second slide slot parallel to the first slide slot, the first sliding block of the operation member is slidably received in the first slide slot, the second sliding block of the latching member is slidably received in the second slide slot, the supporting apparatus further comprises a second resilient member connected between a blind end of the first slide slot and the operation member, and a third resilient member connected between a blind end of the second slide slot and the latching member.

15. The assembly of claim 13, wherein the chassis comprises a bottom wall defining a mounting slot, a sliding portion extends up from a top of the connecting member, and is slidably mounted in the mounting slot.

16. The assembly of claim 15, wherein the mounting slot comprises a top wall and two opposite sidewalls, two latching blocks extend from bottoms of the sidewalls toward each other, the sliding portion defines two opposite slide slots, the latching blocks are slidably inserted into the slide slots, the inserting hole is defined in a top wall of the mounting slot between the latching blocks.

17. The assembly of claim 16, wherein the connecting member comprises a top piece, a main portion extending down from the top piece, and installation portion extending from a side surface of the main portion and adjacent to a bottom of the main portion opposite to the top piece, the sliding portion extends from the top piece opposite to the main portion, the installation portion is fixed to the base.

18. The assembly of claim 17, wherein a receiving space is defined in the side surface of the main portion, the inserting member is slidably received in the receiving space, a through hole is defined in the top piece extending through the sliding portion, the inserting pin extends through the through hole to engage in the inserting hole.

19. The assembly of claim 18, wherein the installation portion defines a guide slot opposite to the through hole, the inserting member further comprises a fixing pin protrudes from the guiding block, the inserting pin is opposite to the fixing pin, a first slot is defined between the first protrusion and the second protrusion for receiving the second sliding block of the latching member, a second slot is defined between the second protrusion and the guiding block for receiving the first sliding block of the operation member, a first end of the first resilient member fits about the fixing pin, and a second end of the first resilient member is abutted against the base.

* * * * *